United States Patent [19]
Kataoka et al.

[11] Patent Number: 5,449,952
[45] Date of Patent: Sep. 12, 1995

[54] SUPERCONDUCTING APPARATUS HAVING DEW-PREVENTABLE PELTIER-EFFECT ELEMENT INTEGRATED THEREWITH

[75] Inventors: Shoei Kataoka, Tanashi; Hideo Nojima, Nara, both of Japan

[73] Assignee: Sharp Kabushiki Kaisha, Osaka, Japan

[21] Appl. No.: 236,109

[22] Filed: May 2, 1994

[30] Foreign Application Priority Data

Jun. 14, 1993 [JP] Japan ............... 5-141974

[51] Int. Cl.⁶ .............. H01L 23/02; H01L 25/04; H01B 12/16; F25B 21/00
[52] U.S. Cl. ..................... 257/716; 257/930
[58] Field of Search ............. 257/716, 661, 930, 662, 257/663; 505/150, 163, 951, 885, 888

[56] References Cited

U.S. PATENT DOCUMENTS

| | | |
|---|---|---|
| 3,814,964 | 6/1974 | Ace . |
| 4,375,157 | 3/1983 | Boesen . |
| 4,980,754 | 12/1990 | Kotani et al. ............ 257/716 |
| 5,006,505 | 4/1991 | Skertic . |
| 5,166,777 | 11/1992 | Kotaoka ................ 257/930 |
| 5,166,777 | 11/1992 | Kataoka . |

FOREIGN PATENT DOCUMENTS

| | | |
|---|---|---|
| 0288022 | 10/1988 | European Pat. Off. . |
| 2661780 | 11/1991 | France ................ 257/930 |
| 59-147472 | 8/1984 | Japan . |
| 60-224253 | 11/1985 | Japan . |
| 61-96782 | 5/1986 | Japan . |
| 64-18280 | 1/1989 | Japan . |

*Primary Examiner*—Sara W. Crane
*Assistant Examiner*—S. V. Clark

[57] ABSTRACT

A superconducting apparatus has a superconducting element, which is a member to be cooled and which exhibits a superconducting phenomenon; an electronic cooling element composed of a cooling electrode provided to the superconducting element via an insulating layer, p-type and n-type semiconductor layers formed to be connected to the cooling electrode, heat-radiation electrodes provided to the semiconductor layers independently of each other, and a heat-radiation plate provided to the heat-radiation electrodes via the insulating layer; lead wires for electrically connecting the superconducting element and the electronic cooling element to external circuits, respectively. The superconducting element and the electronic cooling element, which are integrally packaged, are installed within the first container. Internally sealed by an inert gas atmosphere, the first container is installed within the second container. The second container is internally sealed in a vacuum state.

8 Claims, 3 Drawing Sheets

SUPERCONDUCTING APPARATUS HAVING DEW-PREVENTABLE PELTIER-EFFECT ELEMENT INTEGRATED THEREWITH

BACKGROUND OF THE INVENTION

1. Field of the Invention

The present invention relates to a superconducting apparatus in which an element that exhibits the superconducting phenomenon and a cooling element are combined together.

2. Description of the Prior Art

As is conventionally known, the superconducting phenomenon that certain types of conductive materials, when cryogenically cooled, show zero electric resistance appears when, for example, lead or a niobium alloy is cooled to cryogenic temperature around the liquid helium temperature. Accordingly, when such a superconducting phenomenon is applied to switching devices or high-sensitivity sensor devices, a high-speed, high-sensitivity operation can be implemented without causing any power loss to a greatly remarkable advantage. On the other hand, however, there arises a need of cooling such devices to cryogenic temperatures. In such cases, the devices must be used as they are accommodated in a cooling unit, so called cryostat, using liquid helium and liquid nitrogen. The cooling unit, being large, complex, and expensive, makes a great obstacle to the practicability of the superconducting systems. At present, this problem has not been solved yet, so that the superconducting phenomenon is not widely or commonly used as it stands.

In recent years, there have emerged oxide materials one after another that exhibit a new superconducting phenomenon. Use of these materials, it is expected, will allow superconducting apparatus to be provided at low temperatures closer to room temperature.

However, even if these materials are used, it is indispensable to add cooling means capable of substantially low temperature cooling, in order to make a superconducting phenomenon occur with good reproducibility and thereby impart high reliability to the apparatus. As a result, the whole apparatus would be large in size and high in price.

To solve the above problems, the present inventor has filed an application of patent for a superconducting apparatus in which a superconducting element is disposed on a cooling portion of a Peltier effect element and accommodated in a container (see Japanese Patent Laid-open Publication No. SHO 64-18280).

The aforementioned patent application has also proposed that the container interior is sealed by an inert gas atmosphere. In this case, indeed the device reliability is improved by sealing with the inert gas, but the container would be cooled due to the presence of the inert gas. It would therefore be the actual case, for example, that the cooling efficiency is deteriorated or that moisture in air condenses as dew to stick to the container, disadvantageously.

SUMMARY OF THE INVENTION

The present invention has been developed with a view to substantially solving the above described disadvantages and has for its essential object to improve an apparatus utilizing the Peltier effect as means for cooling an element that exhibits the superconducting phenomenon at low temperatures close to room temperature (e.g. 100K or higher). It is therefore an object of the present invention to provide a superconducting apparatus having a superconducting element and a Peltier effect element integrated together and sealed by an inert gas atmosphere, wherein its cooling efficiency is improved and besides external moisture is prevented from condensing onto the container.

In order to achieve the aforementioned object, a superconducting apparatus of the present invention comprises: a superconductor; an electronic cooling element for implementing heat absorption by being electrically energized, having a cooling-use metal electrode provided to the superconducting element via an insulating layer, p-type and n-type semiconductor layers attached to the cooling-use metal electrode so as to be electrically connected thereto independently of each other, heat-radiation-use metal electrode layers provided to the p-type and n-type semiconductor layers, respectively and independently of each other, and a heat-radiation plate provided to the heat-radiation-use metal electrode layers via an insulating layer; a first container for accommodating the superconductor and the electronic cooling element therein, the first container having an inert gas sealed therein; a second container for accommodating the first container therein, interior of the second container being sealed in a vacuum state; and leads connected to the superconductor and the electronic cooling element, respectively, and drawn out of the second container for connecting the superconductor and the electronic cooling element each to an external circuit.

According to the present invention, a first container in which a superconductor, which is to be cooled, and a cooling element, which exhibits the Peltier effect through electric conduction, are integrally packaged with a less-reactive inert gas atmosphere is further packaged in a second container of vacuum, so that the first container cooled by the cooling element is thermally insulated from external. Therefore, the superconducting apparatus can be very simple in construction and can be operated by a simple control means with improved cooling efficiency, while the superconductor is prevented from deterioration. Also, in the apparatus, external moisture can be prevented from condensing onto both the containers. Furthermore, the superconducting apparatus can be manufactured in small size and with low price.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

An embodiment of the superconducting apparatus according to the present invention is described hereinbelow with reference to the accompanying drawings.

Figure 1:
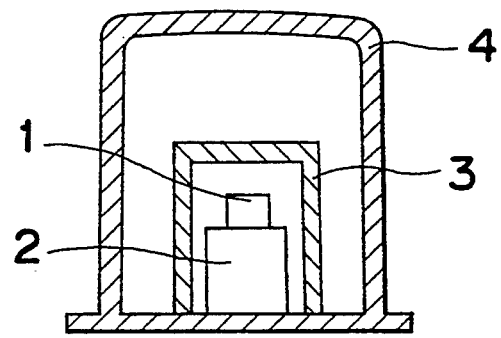
FIG. 1 is a schematic view of a superconducting apparatus showing a first embodiment of the present invention.

FIG. 1 is a schematic view of a superconducting apparatus showing an embodiment of the present invention.

A superconducting element 1, which is a cooling-object member composed of thallium, barium, and calcium in combination with copper and oxygen, and exhibiting the superconducting phenomenon at relatively high temperature, is placed on a cooling device 2 containing an electronic cooling element utilizing the Peltier effect of semiconductor. The superconducting element 1, which exhibits superconductivity at 125K, is utilized as a Josephson device, a microwave sensor, a magnetic sensor, or the like. This arrangement may instead be another that a semiconductor device or an integrated circuit or the like using a superconducting material for interconnection of a semiconductor circuit is placed on a cooling plate thermally connected to an electronic cooling element.

The superconducting element 1 is bonded onto the cooling device 2 via an insulator into a good thermal conductivity state. The superconducting element 1 is sealed within a first container 3 made of glass, metal, or the like, by an inert gas atmosphere of argon, nitrogen, neon, helium or the like, and further is sealed within a second container 4, the inside of which is vacuum. The cooling device 2 is secured to the bottom inner wall of the containers 3, 4 and connected to an external conducting circuit via leads. Similarly, the superconducting element 1 is also connected to an external circuit via leads, so that signal input/output paths are formed.

The above arrangement that the first container 3 is filled with inert gas is based on the following grounds. The superconducting element 1 of high critical temperature, if left in air, would react with moisture to deteriorate to such an extent that it will no longer exhibit the superconductivity normally in a few weeks. On the other hand, if reserved in vacuum, the superconducting element 1 would vary in material composition by elimination of oxygen, resulting in a deterioration. Superconducting materials other than this would also deteriorate in their superconductivity due to reaction in air, elimination of components in vacuum, and the like. Accordingly, the superconducting element 1 of high critical temperature can be improved in reliability by being sealed in a less-reactive inert gas atmosphere.

Electrically exciting tile electronic cooling element of the cooling device 2 causes the cooling device 2 to lower in temperature, so that the superconducting element 1 thermally connected to the cooling device 2 is cooled to its operating temperature. In this process, external vicinity of the first container 3 is held in vacuum by the second container 4. This prevents dew condensation or the like from occurring on the first container 3, so that the superconducting element 1 can be cooled efficiently.

Figure 2:
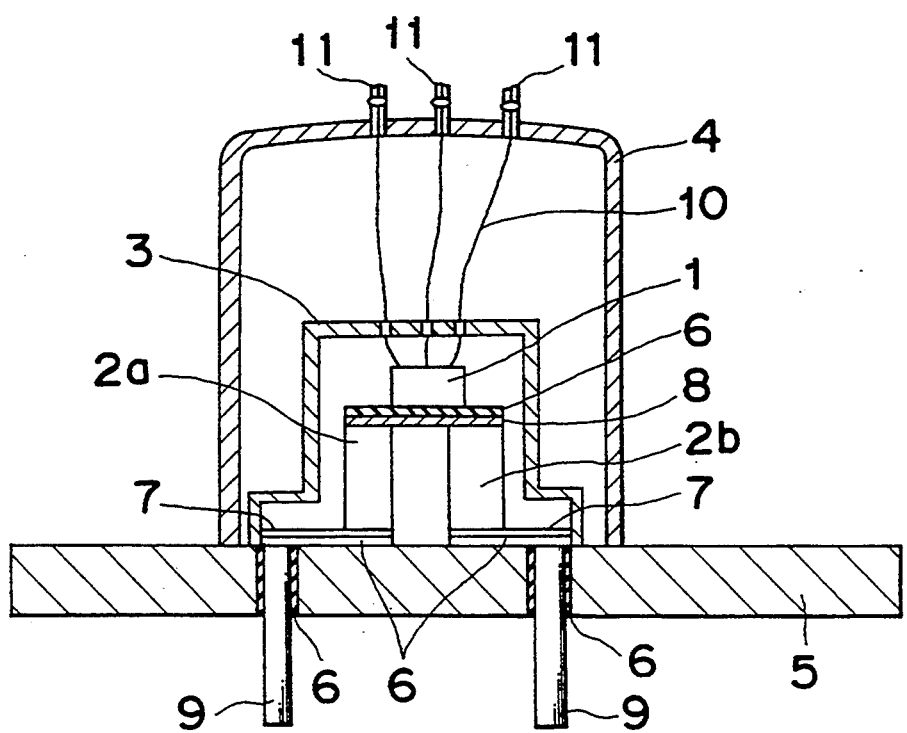
FIG. 2 is a detailed sectional view of the main part of the cooling structure of the superconducting apparatus as shown in FIG. 1.

FIG. 2 is a sectional view showing concrete construction of the superconducting element 1 and the cooling device 2 used in the embodiment of FIG. 1. Heat-radiation electrodes 7 of the electronic cooling element are juxtaposed on a heat-radiation plate 5 forming the bottom of the containers 3, 4 via a thin insulating layer 6. P-type and n-type semiconductor layers 2a, 2b for obtaining the Peltier effect are connected to the heat-radiation electrodes 7, respectively, by their one end. Also a cooling electrode 8 is overlaid on the other end of the two semiconductor layers 2a, 2b. Lead terminals 9 for external connection are penetratedly fixed to the heat-radiation plate 5, electrically insulated therefrom via the insulating layer. The lead terminals 9 and the heat-radiation electrodes 7 are connected to each other, so that the electronic cooling element is electrically energized. The cooling electrode 8 has the superconducting element 1 fixed thereon via the insulating layer 6. The superconducting element 1 is electrically connected to electrode elements 11 penetratedly fixed to the top wall of the second container 4 via wire leads 10, whereby input/output paths of signals to an external circuit are ensured. It is noted that the insulating layer 6 is unnecessary when the superconducting element 1 is coated with insulating material.

Also, joint portions between the heat-radiation plate 5 and the surrounding walls of the first container 3 and the second container 4 are sealed so that the interiors are sealed airtight. The first container 3 is further sealed within the second container 4 of vacuum. The surrounding wall of the second container 4 is formed of a coated glass container coated with silver or the like so that radiation heat from external is prevented or of a metallic container having a gloss.

The semiconductor layers 2a, 2b of the electronic cooling element may be made of an alloy of bismuth, tellurium, antimony, or the like. However, use of metal oxide semiconductors superior in the cooling effect at cryogenic temperatures as well as their compounds offers even greater effect.

With the above-described arrangement, by electrically energizing the cooling device via the lead terminals 9, the cooling electrode 8 is cooled to a low temperature within the first container 3 due to the Peltier effect, the resulting temperature being transferred to the superconducting element 1. Meanwhile, heat generated at the heat-radiation electrodes 7 is efficiently radiated to outside via the heat-radiation plate 5.

Figure 3:
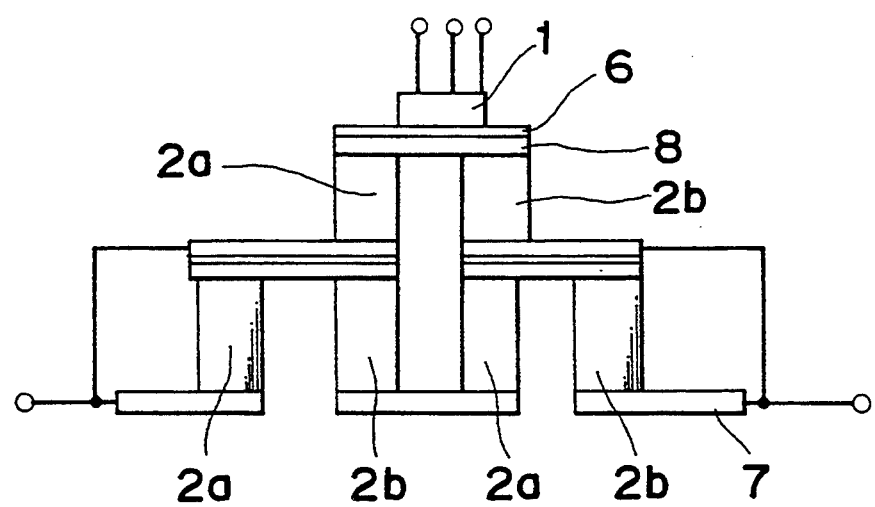
FIG. 3 is a front view showing another embodiment of the electronic cooling element.

FIG. 3 is a front view showing another embodiment of the cooling device used in the present invention.

In this embodiment, electronic cooling elements are arranged in a two-stage cascade connection. Such an arrangement makes it possible to cool a superconducting element placed on a cooling electrode 8 via an insulating layer 6 to even lower temperatures.

The electronic cooling elements are fabricated in the unit of a pair of a p-type semiconductor 2a and an n-type semiconductor 2b, in which case a pair of electronic cooling elements can easily accomplish cooling of approximately 50° C. When further cooling is required, the electronic cooling elements in the cascade arrangement as shown in FIG. 3 may be built into a multi-stage structure as required, so that its cooling ability can be enhanced appropriately. For example, with three- or four-stage cascade connection of the electronic cooling elements, around 150° C. cooling can be easily accomplished, where the superconducting element 1 can be easily maintained at an absolute temperature of approximately 120K. It is noted that already available are materials that exhibit the superconducting phenomenon at such level of low temperatures, as thallium—barium—calcium—copper oxides.

Figure 4A:
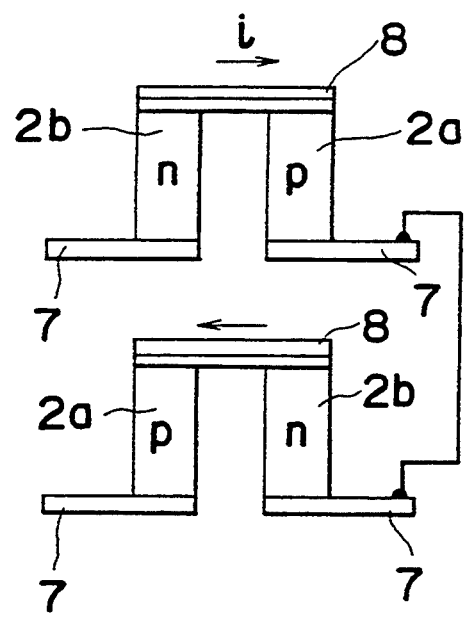
FIGS. 4A and 4B are a view showing connection relation and a perspective view of another embodiment of the electronic cooling element.
Figure 4B:
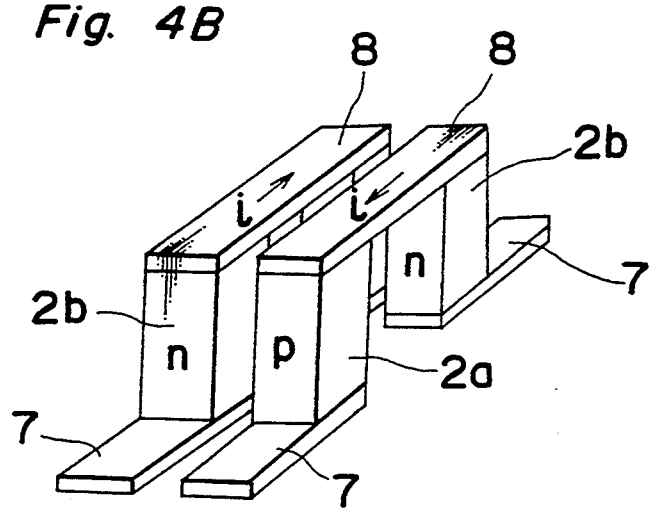

FIG. 4A is a view showing yet another embodiment of the electronic cooling element. Two pairs wherein each pair is comprised of p-type and n-type electronic cooling elements are connected in series as shown in a connection diagram of FIG. 4A, and juxtaposed as shown in FIG. 4B. With this arrangement, magnetic fields formed by circuits each formed by a p-type semiconductor, a cooling electrode, and an n-type semiconductor act in such directions as to cancel each other, so that any adverse effects of magnetic fields can be eliminated. In this way, electronic cooling elements are juxtaposed in turn in such a way that an electric current flows through the cooling electrode 8 of the electronic cooling elements in opposite directions between every two adjoining electronic cooling elements. This allows a cooling device having a high cooling function to be obtained.

Practically available as the superconducting element 1 are, in addition to the aforementioned one, high-sensitivity sensors formed from a super Schottky junction, three-terminal elements composed of a SQUID or semiconductor and a superconductor, and the like. Furthermore, there are integrated circuits using superconducting material for interconnection among circuit elements of Si, GaAs, and the like.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A superconducting apparatus, comprising:
    a superconductor;
    an electronic cooling element for implementing heat absorption by being electrically energized, having a cooling-use metal electrode provided to the superconducting element via an insulating layer, p-type and n-type semiconductor layers attached to the cooling-use metal electrode so as to be electrically connected thereto independently of each other, heat-radiation-use metal electrode layers provided to the p-type and n-type semiconductor layers, respectively and independently of each other, and a heat-radiation plate provided to the heat-radiation-use metal electrode layers via an insulating layer;
    a first container for accommodating the superconductor and the electronic cooling element therein, the first container having an inert gas sealed therein;
    a second container for accommodating the first container therein, interior of the second container being sealed in a vacuum state; and
    leads connected to the superconductor and the electronic cooling element, respectively, and drawn out of the second container for connecting the superconductor and the electronic cooling element each to an external circuit.

2. The superconducting apparatus as claimed in claim 1, wherein the electronic cooling element is provided at least two in number and disposed in such a way that magnetic fields formed by currents flowing through the electronic cooling elements are cancelled by each other.

3. The superconducting apparatus as claimed in claim 1, wherein the heat-radiation plate provided via the heat-radiation-use metal electrode layers forms a bottom portion of the containers.

4. The superconducting apparatus as claimed in claim 2, wherein the heat-radiation plate provided via the heat-radiation-use metal electrode layers forms a bottom portion of the containers.

5. The superconducting apparatus as claimed in claim 1, wherein a surrounding wall of the second container is formed of a member that reflects radiation heat derived from outside.

6. The superconducting apparatus as claimed in claim 2, wherein a surrounding wall of the second container is formed of a member that reflects radiation heat derived from outside.

7. The superconducting apparatus as claimed in claim 3, wherein a surrounding wall of the second container is formed of a member that reflects radiation heat derived from outside.

8. The superconducting apparatus as claimed in claim 4, wherein a surrounding wall of the second container is formed of a member that reflects radiation heat derived from outside.

* * * * *